United States Patent
Irisawa

[11] Patent Number: 5,466,885
[45] Date of Patent: Nov. 14, 1995

[54] MAGNETICALLY SHIELDING STRUCTURE

[75] Inventor: Daiichi Irisawa, Kanagawa, Japan

[73] Assignee: Furukawa Denki Kogyo Kabushiki Kaisha, Tokyo, Japan

[21] Appl. No.: 277,274

[22] Filed: Jul. 21, 1994

Related U.S. Application Data

[63] Continuation of Ser. No. 853,725, May 27, 1992, abandoned.

[30] Foreign Application Priority Data

Sep. 27, 1990 [JP] Japan .................................... 2-255255

[51] Int. Cl.$^6$ ...................................................... H05K 9/00
[52] U.S. Cl. .................................... 174/35 MS; 335/216; 335/301; 505/872
[58] Field of Search .......................... 174/15.4, 15.5, 174/35 R, 35 MS; 505/846, 872; 335/216, 301; 307/91

[56] References Cited

U.S. PATENT DOCUMENTS

| | | | |
|---|---|---|---|
| 4,190,817 | 2/1980 | Rabinowitz | 335/216 |
| 4,409,579 | 10/1983 | Clem et al. | 335/216 |
| 4,942,379 | 7/1990 | Ogawa et al. | 335/301 |
| 5,061,685 | 10/1991 | Kosuge et al. | 505/1 |
| 5,134,341 | 7/1992 | Jödicke et al. | 505/700 X |
| 5,159,219 | 10/1992 | Chu et al. | 505/876 X |
| 5,164,696 | 11/1992 | Kotani | 335/216 |
| 5,179,074 | 1/1993 | Fiedziuszko et al. | 505/1 |
| 5,182,254 | 1/1993 | Owens | 505/1 |
| 5,182,914 | 2/1993 | Barclay et al. | 505/894 X |
| 5,187,327 | 2/1993 | Ohta et al. | 174/35 R |

FOREIGN PATENT DOCUMENTS

| | | |
|---|---|---|
| 58-148499 | 9/1983 | Japan . |
| 59-90997 | 5/1984 | Japan . |
| 1253690 | 10/1989 | Japan . |
| 3-197897 | 8/1991 | Japan . |

*Primary Examiner*—Kristine L. Kincaid
*Assistant Examiner*—Christopher Horgan
*Attorney, Agent, or Firm*—Jacobson, Price, Holman & Stern

[57] ABSTRACT

Magnetically shielding structure in which by combining magnetically shielding members of various qualities with each other, its magnetically shielding capability is made to improve, and the greatly lower magnetic field than an externl one can be realized effectively. For this purpose, by providing a cylindrical magnetically shielding body made of a superconductive material manifesting Meissner effect and high permeability members of a predetermined sizes of various shapes, and by combining them variously with each other leaving spaces betwen them, magnetic inductions are made to generate in the high permeability members, and a penetrating magnetic field is made to be shorted magnetically.

6 Claims, 8 Drawing Sheets

MAGNETICALLY SHIELDING STRUCTURE

This application is a continuation of Ser. No. 07/853,725, filed May 27, 1992, now abandoned.

TECHNICAL FIELD

The present invention relates to a magnetically shielding structure utilizing a superconductor cylinder and, in particular, it relates to a magnetically shielding structure in which magnetically shielding capability is made to improved by combining magnetically shielding materials of various different properties and a penetrating magnetic field from the opening portion of the superconductor cylinder is reduced to a very small value, the volume of a usable highly magnetically shielded space inside the cylinder bore is increased, or a very feeble magnetic field can be realized in the cylinder bore even in the case of a short superconductor cylinder, thereby a much feebler magnetic field than an external one can be effectively realized in the cylinder bore.

BACKGROUND ART

In a magnetically shielding structure constructed by a superconductor, Meissner effect is utilized for the magnetic shield. That is, a material having Meissner effect is, for example, formed into a cylinder shape to form a shielding body and it is cooled below the critical temperature Tc for the transition to a superconductive state for making the shielding body a diamagnetic thereby a magnetic flux is forced out to the exterior of the shielding body, and the internal space of the shielding body is magnetically shielded.

On the other hand, in the case of a shielding structure with a high permeability material being commonly used without utilizing a superconductor, where a shielding body is formed into a cylinder with the high permeability material, for example, and if the shielding body is held in a magnetic field, magnetic induction is generated in the wall of the shielding body and the magnetic field is short-circuited along the shielding body, thereby the internal bore space of the cylinder is magnetically shielded.

In such a magnetically shielding structure utilizing a superconductor, although the magnetically shielding capability of a cylindrical shielding body, for example, is high enough for a magnetic field parallel to the center axis of the cylinder (longitudinal magnetic field), yet the magnetically shielding capability for a magnetic field perpendicular to the center axis (lateral magnetic field) is not enough. Therefore, there is a problem that the length of the cylinder has to be long in comparison with the inner diameter of the cylinder.

On the other hand, in the case of a cylindrical shielding body formed with a high permeability material, for example, the shielding capability for longitudinal magnetic field is not enough in comparison with that for lateral magnetic field, and therefore, to obtain high shielding capability, a plurality of cylinder walls have to be laminated and a structure in which the inner layer is shorter than the outer layer has to be adopted. In the result, even in the case of a high permeability material being used, there has been a problem that the length of a cylinder at outermost layer becomes long, and when a usable space is to be larger the length has to be longer. Further, since the shielding effect of a high permeability material for an inside feeble magnetic field depends upon the initial specific permeability thereof, the shielding capability is not so enough, and for improving shielding capability the shielding body has to be made to have a multilayer structure, which causes a problem that the shielding body becomes expensive.

DISCLOSURE OF INVENTION

The present invention is invented in consideration of the above-mentioned various problems, and therefore, an object of the invention is to provide a magnetically shielding structure in which a volume of a usable feeble magnetic field space is increased and an extremely low magnetic field can be realized being free from the influence of a residual magnetism by improving magnetically shielding capability with the combination of magnetically shielding materials of various different properties.

According to the present invention, the above-mentioned object can be achieved with the magnetically shielding structure as described in each of the claims.

In the case of a magnetically shielding structure according to the present invention, a cylindrical magnetically shielding body composed of a superconductive material manifetsing the Meissner effect is combined in various manners with a high permeability member having predetermined sizes and shapes so that a penetrating magnetic field is magnetically shorted by the magnetic induction generated in the high permeability member.

In the cylindrical shielding body being composed of a material manifesting Meissner effect, a shielding current flows according to Lenz's law to form a demagnetizing field against an external magnetic field. The penetrating magnetic field toward the interior of the cylinder is attenuated by the demagnetizing field.

The theoretical expressions of an internal magnetic field Hi in the superconductor cylinder can be expressed for the external magnetic field Ho in various directions as shown below.

Lateral field: $Hi=Ho \cdot exp[-1.84(Z/r)]$ (1)

Longitudinal field: $Hi=Ho \cdot exp[-3.83(Z/r)]$ (2)

where Z is the distance from the opening end of the cylinder, and r is the radius of the cylinder.

As clearly seen from the expressions, the magnetically shielding capability of a superconductor cylinder is high for a magnetic field being parallel to the center axis of the cylinder (longitudinal magnetic field) and is low for a magnetic field being perpendicular to the center axis. It is understood from the above expressions that if the same shielding effect is to be obtained for the lateral magnetic field as that obtained for the longitudinal magnetic field, a cylinder of double length is needed when the inner diameters of the superconductor cylinders are the same. It is, therefore, necessary to decrease the internal magnetic field more effectively for the case when a lateral magnetic field is applied than for the case when a longitudinal magnetic field is applied.

Figure 18:
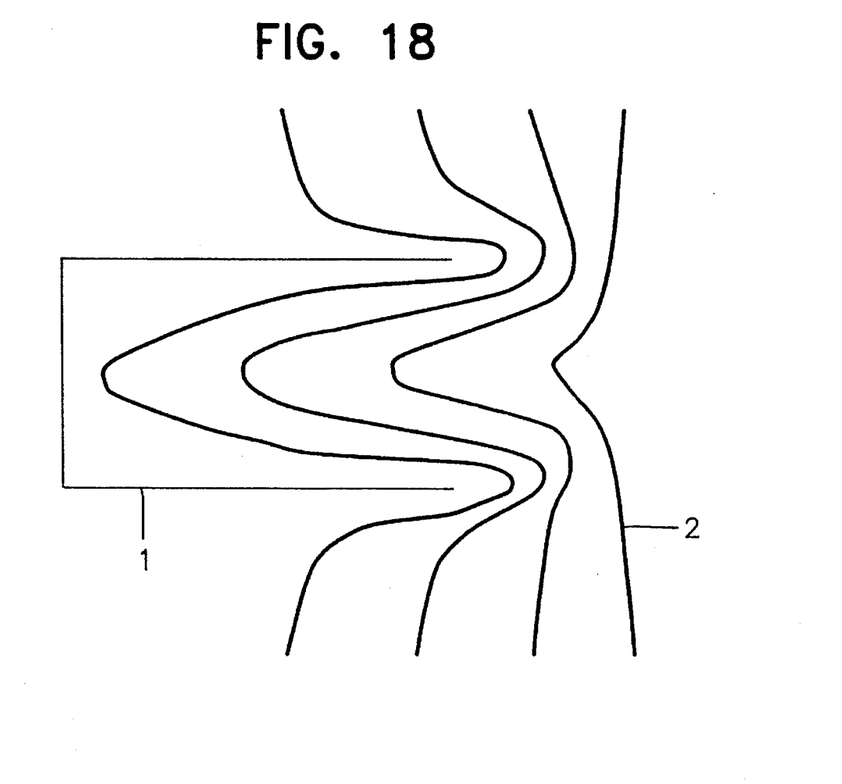
FIG. 18 is a schematic cross sectional end view showing the magnetic flux flow when a lateral magnetic field is applied to a superconductor cylinder of the conventional type.

In FIG. 18, the flow of a magnetic flux (2) is shown when a lateral magnetic field is applied to a superconductor cylinder (1) having an open end and a closed end. According to tha present invention, a magnetic flux penetrating into the cylinder bore with the distribution as shown in the FIG. 18 may be magnetically shorted by means of a magnetic induction property of the above-mentioned high permeability member so as to decrease the quantity of the penetrating flux into the inside bore of the superconductor cylinder. Since there is a possibility of an existence of a residual magnetic field in the high permeability member, it is necessary for the high permeability member to dispose in a position where the magnetic influence of the residual magnetic field can be neglected with respect to the shielding effect for the cylinder bore.

According to the present invention, in a magnetically shielding structure of a cylindrical shielding body composed of a superconductive material manifesting Meissner effect after the transition from a normal conductive state to a superconductive state when the shielding structure is cooled below the critical temperature, a high permeability member having a shape which is adapted to produce a magnet icinduction for shorting a penetrating magnetic field is incerted within the cylindrical body in the vicinity of the opening end thereof with a gap from the inner wall of the cylindrical body. Thus, against the penetrating magnetic field showing an attenuating distribution in the direction toward the center on the longitudinal axis of the cylindrical shielding body which is composed of a material manifesting Meissner effect, the magnetic induction may be generated in the inserted high permeability member, thereby the penetrating magnetic field is magnetically shorted and the magnetic field penetrating into the inside of the cylindrical shielding body is further decreased.

In general, when a uniform lateral magnetic field Ho is applied to a cylinder of a high permeability member having an infinite length, the shielding capability (Hi/Ho) is expressed by, $$Hi/Ho = 2r/\mu t \quad (3)$$

where $\mu$ is permeability, t thickness and r radius of the cylinder.

From the equation (3), other cases of different shapes can be inferred, and in general, it is seen that the larger permeability gives larger shielding effect. It can be also inferred from the equation (3) that, in general, the larger shielding effect may be obtained when the larger thickness is given.

An insertion position where a largest shielding effect can be obtained by the insertion of the high permeability member into the inside of the superconductor cylinder lies between an inside position from the opening end where the influence of the opening end of the superconductor cylinder is not exerted and a depper inside position where the residual magnetic field Hr of the high permeability member equals the internal magnetic field to be expressed by the product of the shielding power Hf of the high permeability member and the magnetic field Hs inside the superconductor cylinder as follows $$Hr \leq Hf \times Hs \quad (4)$$

That is, on the one hamd, if the high permeability member is disposed in a position where the intensity of the magnetic field inside the superconductor cylinder equals to that of the residual magnetic field, the high permeability member does not show an enough shielding effect, and other hand, if the high permeability member is disposed in a position where the intensity of the magnetic field inside the superconductor cylinder is lower than that of the residual magnetic field, the high permeability member disturbs the magnetic field inside the superconductor cylinder and exerts negative influence on the shielding effect. In case a disk-shaped high permeability member is used, for example, the effect of the position of the high permeability disk is as shown below, assuming that a residual magnetic field Hr=0.01, the shielding power of the disk Hf=0.33 and external magnetic field Ho=1, from equations (1) and (4), $$0.01 \leq 0.33 \cdot 1 \cdot exp[-1.84(Z/50)] \quad (4'),$$

then, $Z \leq 95$.

In this case, therefore, the best shielding effect can be obtained in the range between an inside position on 40 mm from the opening end, where the influence of the opening end is not exerted, and a deeper position on 95 mm from the same opening end.

Moreover, it is found that in the range where the best shielding effect can be obtained, in a case of a superconductor cylinder, for example, a disk of high permeability material having an outer diameter which is smaller than 3/10 of the inner diameter of the cylinder has almost no shielding effect. When the center of the disk is on the axis of the superconductor cylinder and it is disposed outside the range of the best effect, however, in some case it exhibits a shielding effect. For example, in a case where 2 disks of high permeability material are disposed in the vicinity of the center inside the superconductor cylinder which is opened at the both ends and which is so short that the influence of the residual magnetic field of the high permeability material can be neglected, the 2 disks exhibit shielding effect.

In the present invention, another embodiment is disclosed in which a high permeability member has a diaphragm or ring shape on which a through opening or hole is provided in the direction coaxial with the longitudinal direction of the cylinder-shaped shielding body. Owing to this, the operability for the manipulation to the inside of the cylindrical shielding body is increased for example.

In a positional range where the best shielding effect can be obtained, the shielding effect of a ring plate of a high permeability material having a through hole of a diameter smaller than 3/10 of the inner diameter of a superconductor cylinder does not differ from that of a ring plate of the same material without a through hole. When it is disposed outside the best positional range, however, the dimension of the through hole diameter, which shows the same shielding effect as that of the plate without a through hole, is changed.

In the present invention, a further embodiment is disclosed in which a plurality of said high permeability members are arranged in parallel at a predetermined interval in the direction of the cylinder axis. That is, if the high permeability members are arranged in parallel to the opening end of the superconductor cylinder, higher shielding capability can be obtained in comparison with the case in which the high permeability member is used in single.

As explained in the above, according to the present invention, there is provided a magnetically shielding structure comprising a cylindrical magnetically shielding body of a superconductive material manifesting Meissner effect and a high permeability member having a predetermined shape and size of equal to or larger than 3/10 of the inner diameter of the cylindrical body and disposed within said body in the vicinity of the opening end of said body. Therefore, a penetrating magnetic field, which shows an attenuating distribution toward the center direction on the longitudinal axis of the cylindrical shielding body composed of a material manifesting Meissner effect, is magnetically shorted by magnetic induction generated in the high permeability member arranged in combination with the body, and in the result the magnetic field penetrating into the inside of the cylindrical body is further decreased. The shielding capability of the above-mentioned shielding structure is higher than that of a single cylindrical shielding body of the same length or that of a cylindrical body of a laminated high permeability materials. Further, the length of the cylinder required for obtaining a necessary shielding effect or a necessary low magnetic field space can be made shorter, which makes it possible to lower the cost for the manufacture of a shielding equipment.

It is noted that the wide variety of shape designs of the high permeability member may be made if the member can be inserted into the inside of the cylindrical shielding body composed of the superconductor and magnetic induction can be generated in the high permeability member for magnetically shorting the penetrating magnetic field. That is, in the case of a cylindrical shielding body, for example, the high permeability member having each one of following shapes can be used: a thin or thick disk-shaped one, a ring-shaped one, a disk plate-shaped one having an oute flange ring extending in the longitudinal direction of the cylindrical shielding body, etc.

In the present invention, yet another embodiment is disclosed in which said high permeability member has a through hole which is coaxial with the longitudinal axis of the cylindrical shielding body. Owing to this, the operability foe tha manupilation to the inside of the cylindrical shielding body is increased.

In the present invention a still further embodiment is disclosed in which a plurality of said high permeability members are arranged in parallel to the opening end of the cylindrical shielding body at a predetermined interval in the direction of the thickness thereof. That is, if the high permeability members are arranged in parallel to the opening end of the superconductor cylinder, higher shielding performance can be obtained in comparison with the case in which the high permeability member is used in single.

BEST MODE FOR CARRYING OUT THE INVENTION

[Embodiment A-1: Positional effect of a disk plate]

Figure 1:
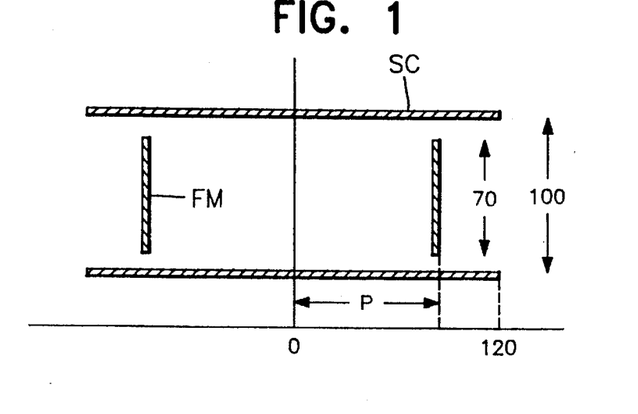
FIG. 1 shows a schematic cross sectional end view of an embodiment of the present invention composed of a double open end type superconductor cylinder and disk plates made of a high permeability material.

FIG. 1 shows a schematic cross sectional end view of a double open end type superconductor cylinder of bismuth group oxide (BiSrCaCuO) (hereinafter referred to as superconductor cylinder) and a disk plate of a high permeability material. The superconductor cylinder SC has the dimensions of 100 mm in inner diameter, 240 mm in length and 5 mm in wall thickness. The disk plate FM of a high permeability material has the dimensions of 70 mm in diameter and 0.5 mm in thickness, and has the permeability of 10000.

Figure 2:
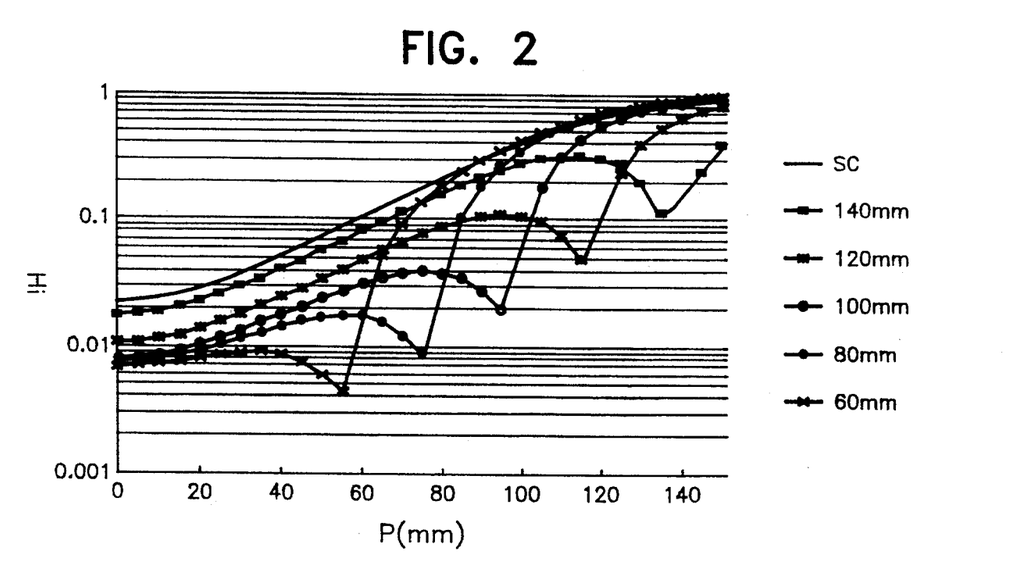
FIG. 2 is a diagram showing an internal magnetic field distribution on the axis of the superconductor cylinder body arranged with tha disk plate of the high permeability material.

The magnetic distribution on the cylinder axis was measured with application of uniform lateral magnetic field of 1 (Oe) outside to the superconductor cylinder SC. FIG. 2 is a diagram showing a distribution of an internal magnetic field $Hi(Z)$ along the center axis of the superconductor cylinder when the high permeability disk plate FM is disposed on a position at a distance P (mm) from the center position of the superconductor cylinder. In FIG. 2, the ordinate denotes the internal magnetic field $Hi(Z)$, and the abscissa denotes the distance P (mm) from the center of the superconductor cylinder. Solid line curve SC shows the internal magnetic field distribution $Hsc(Z)$ when the superconductor cylinder is applied alone without said high permeability disk plate FM, and a line plotted with a mark ■ shows the distribution $Hi(Z)$ when the distance P=140 mm, a line plotted with a mark ✕ shows the same when the distance P=120 mm, a line plotted with a mark ○ shows the same when the distance P=100 mm, a line plotted with a mark ● shows the same when the distance P=80 mm and a line plotted with a mark × shows the same when the distance P=60 mm. The position of the opening end corresponds P=120 mm.

From FIG. 2, it is clearly understood that the high permeability disk plate FM short-circuits a magnetic field which is to permeate through the opening end into the inside bore of the superconductor cylinder SC, and improves the magnetic shielding capability for the inside bore of the superconductor cylinder. It is also understood that even when the high permeability disk plate is disposed at a distance P=140 mm (outside the superconductor cylinder), the internal magnetic field is better than that when the superconductor cylinder is applied alone without the disk plate. When P=60 mm, a magnetic field in a space enclosed by the high permeability disk plate and the superconductor cylinder is lower than 0.01 [Oe]. To make the magnetic field of the same space lower than 0.01[Oe] by the use of the superconductor cylinder of double open end type only, at least 370 mm length of the cylinder having the same inner diameter is required. Therefore, it is understood that a volume of the usable feeble magnetic field space is increased by the combination as described in the above embodiment.

Figure 3:
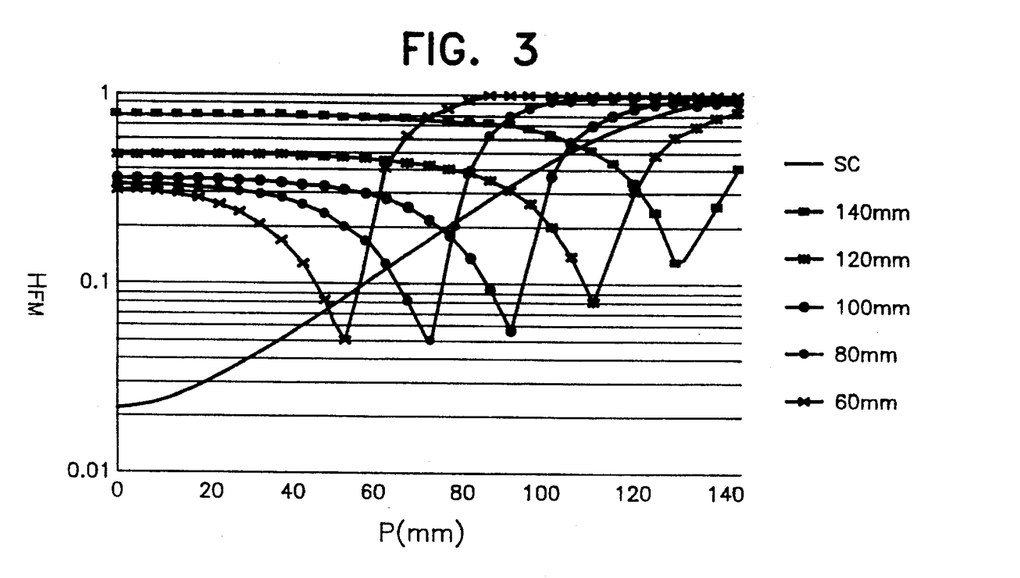
FIG. 3 is a diagram showing shielding capability distribution of the high permeability material disks which are standardized for the magnetic field distribution shown in FIG. 2.

FIG. 3 is a diagram showing the shielding capability distribution $H_{FM}(Z)$ Of a high permeability disk plate, which is obtained by standardizing the magnetic field distribution Hi(Z) shown in FIG. 2 with the internal magnetic field distribution Hsc(Z) of the superconductor cylinder without the disk plate. In the figure, the ordinate denotes the shielding faculty $H_{FM}$, and the abscissa denotes the distance P (mm) from the center of the superconductor cylinder. Solid line curve SC shows the internal magnetic field distribution Hsc(Z) when the superconductor cylinder is applied alone without said high permeability disk plate FM, and a line plotted with a mark ■ shows the distribution Hi(Z) when the distance P=140 mm, a line plotted with a mark ✕ shows the same when the distance P=120 mm, a line plotted with a mark ○ shows the same when the distance P=100 mm, a line plotted with a mark ● shows the same when the distance P=80 mm and a line plotted with a mark × shows the same when the distance P=60 mm. The position of the opening end corresponds P=120 mm.

The standardization is performed as shown below.

$$H_{FM}(Z)=Hi(Z)/Hsc(Z) \qquad (5)$$

where Z shows the distance from the open end.

As shown in FIG. 3, it is understood that the shielding capability is improved with the deeper position of the high permeability disk plate inside the superconductor cylinder.

Figure 4:
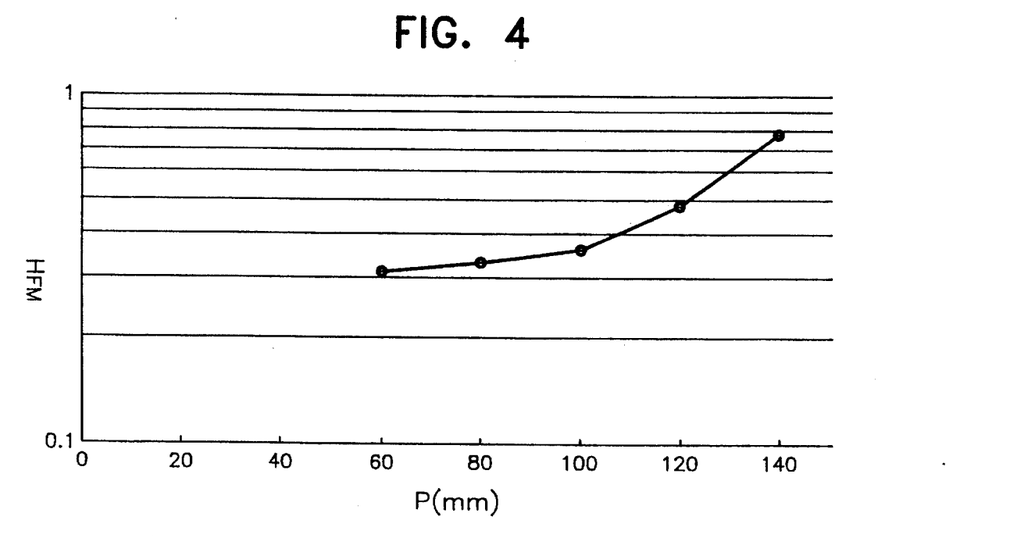
FIG. 4 is a diagram in which the shielding capability of the high permeability material disk on the center axis of the superconductor cylinder is plotted.

FIG. 4 is a diagram in which the shielding capability $H_{FM}(120)$ of the high permeability disk plate at the center position (Z=120 mm) of the superconductor cylinder is plotted. The ordinate denotes the shielding faculty $H_{FM}$, and the abscissa denotes the distance P (mm) from the center of the superconductor cylinder. The shielding capability is improved with the deeper position of the high permeability disk from the outside of the opening end toward the inside of the superconductor cylinder bore. In the inner portion from P=80 mm, the shielding capability is almost constant. It is clearly seen from the result that a magnetic field outside the opening end of the superconductor cylinder is pulled into the inside bore by the magnetic induction generated within the high permeability disk plate. Therefore, with respect to the magnetic shielding effect for the inside bore, if the high permeability disk plate is disposed in a position deeper than a predetermined distance from the opening end, the influence of the opening end can be neglected and the shielding capability shows an almost constant and best value.

The shielding capability distribution $H_{FM}(Z)$ is almost constant at the center of a superconductor cylinder. This means that the distribution recovers the inclination of the internal magnetic field distribution in the case of the superconductor cylinder alone. Therefore, if the high permeability member arranged inside the superconductor cylinder, the magnetic field distribution Hi(Z) at the center side position of the cylinder bore where there is no influence of the high permeability material can be expressed as follows:

$$Hi(Z)=H_{FM} \cdot Ho \cdot \exp[-1.84(Z/r)] \qquad (6)$$

where Z is the distance from an opening end, r is the radius of the inner bore of the superconductor cylinder, and Ho is an external magnetic field.

[Embodiment A-2: Effect of the radius of a disk plate]

Figure 5:
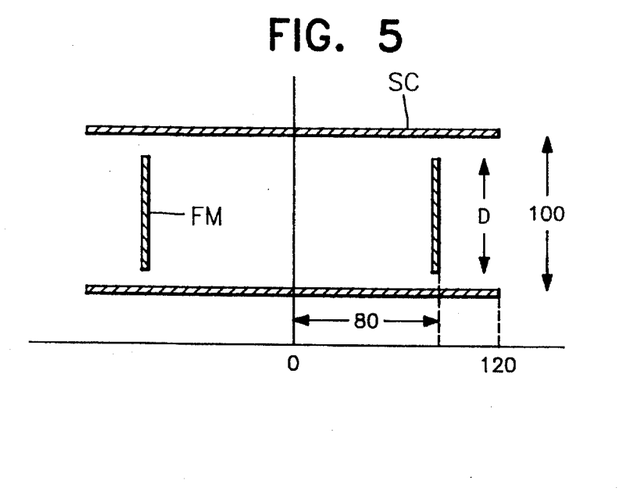
FIG. 5 shows a schematic cross sectional end view of an embodiment of the present invention composed of a double open end type superconductor cylinder and the disk plates of a high permeability material having various kinds of diameters.

As shown in FIG. 5, high permeability disk plates FM having various diameters D and the thickness of 0.5 mm are so disposed that each center axis of the disk plates becomes coaxial with the center axis of the cylinder SC and the plates are located in a position at 80 mm from the center of the double open end type superconductor cylinder SC of bismuth group oxide (BiSrCaCuO) having the inner diameter of 100 mm, the length of 240 mm, and the wall thickness of 5 mm, and the shielding capability $H_{FM}$ in the center position on the the cylinder axis is measured with the application of uniform lateral magnetic field of 1 (Oe) to outside the cylinder SC.

Figure 6:
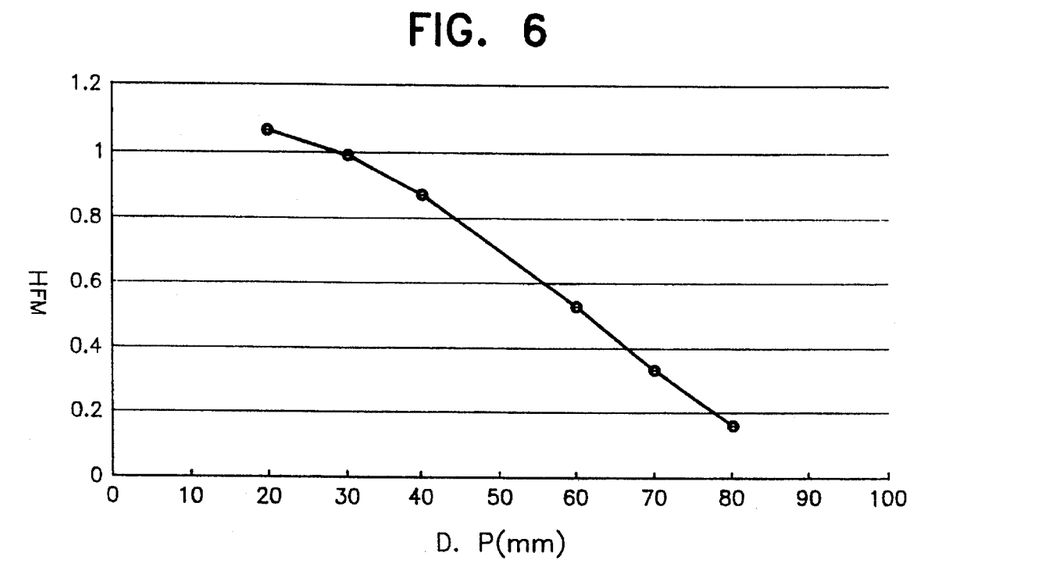
FIG. 6 is a diagram showing the relation between the shielding capability and the diameter of the disk plates of the high permeability material.

FIG. 6 is a diagram showing the results of the measurement. In the figure, the ordinate denotes the shielding capability $H_{FM}$, and the abscissa denotes the diameter D (mm) of the high permeability disk plate FM. From the figure, it is clear that the shielding capability is improved if the diameter of the disk plate is closer to the inner diameter of the superconductor cylinder. On the contrary, if the diameter of the disk plate is smaller than 3/10 of the inner diameter of the superconductor cylinder, the shielding capability becomes more than 1, thus the internal magnetic field may be found to be worse in comparison with the case of the superconductor cylinder alone.

As described in the above, it is confirmed that when the high permeability disk plate is disposed in a position where the influence of the opening end is negligible, if the diameter of the disk plate is smaller than 3/10 of the inner diameter of the superconductor cylinder, there is no shielding effect.

If the diameter of the high permeability disk plate is smaller than 3/10 of the inner diameter of the superconductor cylinder, the magnetic short circuit effect of the disk plate becomes small, and at the same time, the penetrating magnetic field through the gap between the cylinder and the disk plate is increased and the effect of the disk plate is substantially lost. Therefore, it is desirable to make the diameter of the high permeability disk plate as close as possible to the inner diameter of the superconductor cylinder to improve the shielding effect inside the superconductor cylinder.

There is no shielding effect when the high permeability disk plate having the diameter smaller than 3/10 of the inner diameter of a superconductor cylinder is disposed in a position where the influence of the opening end is exerted. A shielding effect, however, can be observed when two pieces of the high permeability disk plate are disposed with a gap therebetween in the vicinity of the center of the inside of a double open end type superconductor cylinder which is so short as not to be influenced by the residual magnetic field of the high permeability material.

[Embodiment A-3: Blind bore type superconductor cylinder]

Figure 7:
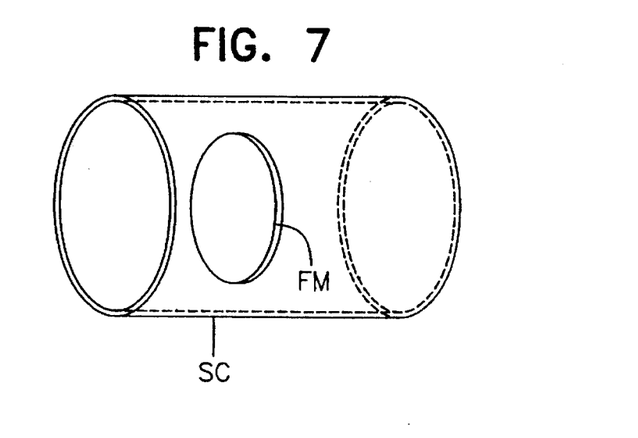
FIG. 7 is a schematic perspective view in which a disk plate of a high permeability material is disposed inside a single open end type superconductor cylinder.

FIG. 7 is a schematic perspective view in which a disk plate FM of a high permeability material is disposed inside a blind bore or single open end type superconductor cylinder SC of a bismuth group oxide (BiSrCaCuO) (hereinafter referred to as a superconductor cylinder). The dimensions of the blind bore type superconductor cylinder are 100 mm in inner diameter, 120 mm in length, and 5 mm in wall thickness. The dimensions of the high permeability disk plate are 80 mm in diameter and 0.5 mm in thickness, and the permeability of the disk material is 10000.

At first, a uniform lateral magnetic field of 1 [Oe] was applied to the superconductor cylinder alone, and a magnetic field on the inside bottom surface at the cylinder axis was measured. In the result, magnetic field intensity of 0.0153 [Oe] was obtained in the case of the superconductor cylinder alone (without th disk plate).

Next, as shown in FIG. 7, the high permeability disk plate was placed inside the superconductor cylinder making the center axis of the disk plate coincide with the center axis of the cylinder, and the disk plate was disposed in a position at 80 mm from the bottom of the cylinder toward the opening end, and a measurement was made under the same condition mentioned above. In this case, the obtained magnetic field intensity at the inner bottom surface of the superconductor cylinder was 0.0050 [Oe]. When the result is converted to shielding capability, the value of 0.33 is obtained, which almost corresponds to the value obtained when P=80 mm in FIG. 4 of the embodiment A-1. It is found, therefore, that a blind bore or single open end type superconductor cylinder shows the same effect as that of a double open end type superconductor cylinder of double length.

[EmbodimentB-1: Flanged disk of a high permeability material]

Figure 8:
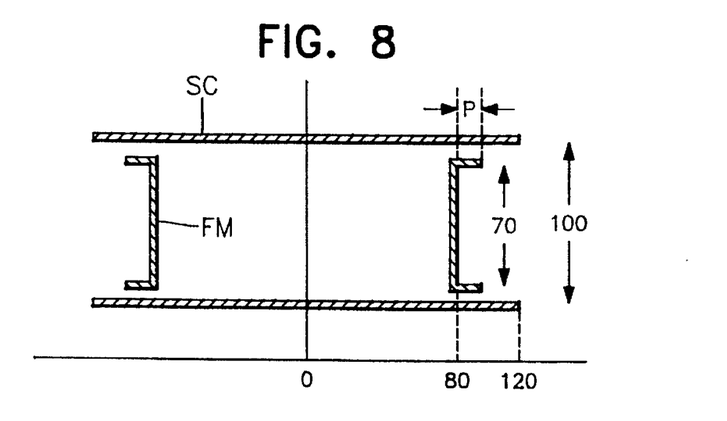
FIG. 8 shows a schematic cross sectional end view of another embodiment of the present invention composed of a double open end type superconductor cylinder and a pair of flanged disks of a high permeability material.

FIG. 8 is a schematic cross sectional end view of a double open end type superconductor cylinder SC of a bismuth group oxide (BiSrCaCuO) (hereinafter referred to as a superconductor cylinder) and a flanged disk FM of a high permeability material with an outer flange (hereinafter referred to as a flanged disk). The dimensions of the former are 100 mm in inner diameter, 240 mm in length, and 5 mm in wall thick-ness. Those of the latter are 70 mm in inner diameter, 30 mm in length, 0.5 mm in thickness and the permeability is 10000.

Figure 9:
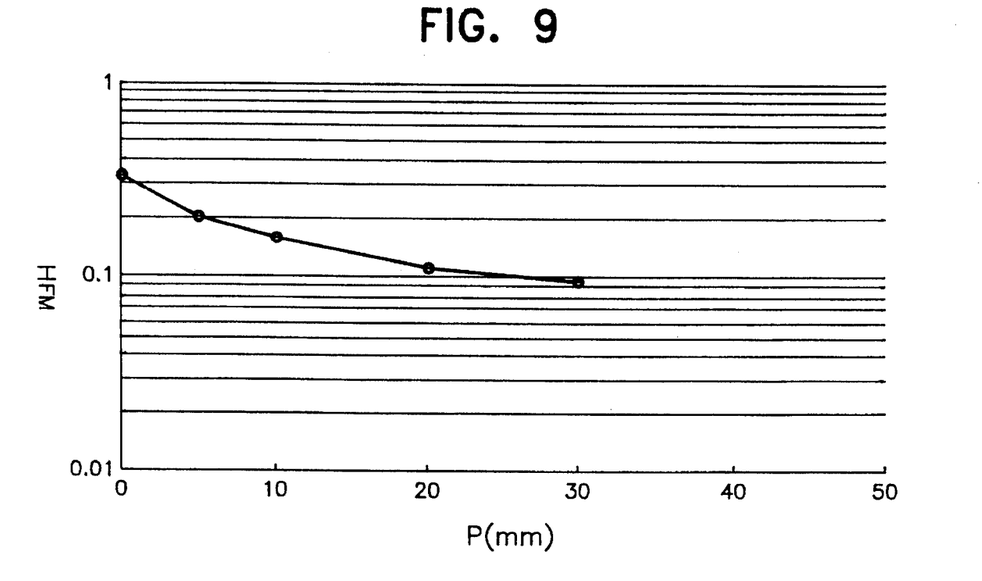
FIG. 9 is a diagram showing the result of measurement of the shielding capability when the flange width P is changed.

A pair of flanged disks was disposed inside the superconductor cylinder as shown in FIG. 8, and an experiment was made varying the flange width P. The result is shown in FIG. 9 in which the ordinate denotes shielding capability $H_{FM}$, and the abscissa denotes the flange width P. As shown in the figure, it is understood that when the width P is widened as to be a single side flange type, the shielding capability is improved than that in the case where p=0, that is, when the disk is a simple flat disk plate. When the width P is made wider than a certain value the shielding capability approaches a constant value.

To be concrete, in this embodiment, a magnetic field at the center position on the cylinder axis was measured in applying a uniform lateral magnetic field of 1 [Oe] to outside a superconductor cylinder and magnetic field intensity of 0.0223 [Oe] was obtained in the superconductor cylinder. The flanged disks FM were so placed inside a double open end type superconductor cylinder SC that the opening ends of the disks coincide with those of the superconductor cylinder, and the center axes of the cylinder and the disks were put on a line, and the bottom surfaces of the disks were placed at a distance of 80 mm on both sides from the center position of the superconductor cylinder, then the measurement was made under the same condition mentioned above. In this case, the value of the magnetic field intensity obtained at the center position of the superconductor cylinder bore was 0.0021 [Oe]. From the result, it is understood that the flanged disk shorts a magnetic field penetrating into the bore of the superconductor cylinder and improves the magnetic shielding capability inside bore of the cylinder.

[Embodiment B-2: Blind bore type superconductor cylinder]

Figure 10:
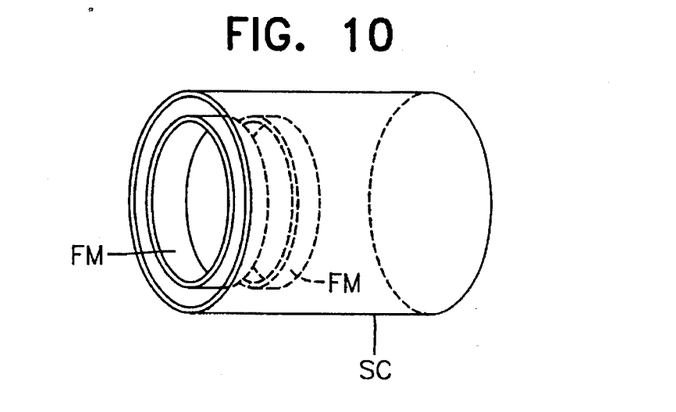
FIG. 10 shows a schematic perspective view of still another embodiment of the present invention composed of a single open end type superconductor cylinder and a flanged disks of a high permeability material.

FIG. 10 is a schematic perspective view of a blind bore or single open end type superconductor cylinder SC of a bismuth group oxide (BiSrCaCuO) (hereinafter referred to as a blind bore type superconductor cylinder) and a flanged disk FM. The dimensions of the former are 100 mm in inner diameter, 120 mm in length, and 5 mm in wall thickness. The dimensions of the latter are 70 mm in inner diameter, 5 mm in flange width and 0.5 mm in thickness, and the permeability is 10000. At first, a single flanged disk FM was inserted in the vicinity of an opening end of a blind bore type superconductor cylinder SC. The inside magnetic field intensity at the center position on the cylinder axis was measured in applying a uniform lateral magnetic field of 1 [Oe] to the outside of the superconductor cylinder. In the result, magnetic field intensity of 0.0153 [Oe] was obtained in the superconductor cylinder SC. Next, a pair of flanged disks were arranged inside the blind bore type superconductor cylinder making the directions of opening ends coincide with each other, and the center axes of cylinder and the disks are put on a line, and the bottom surfaces of the disks of a high permeability material were disposed at 80 mm and 115 mm from the bottom surface of the superconductor cylinder, and the measurement was made under the same condition mentioned above. The field intensity in the vicinity of the inner bottom surface on the axis of the superconductor cylinder was 0.0011 [Oe]. The magnetic field intensity at the center position was 0.0048 [Oe] when only one flanged disk of a high permeability material disposed at a distance of 115 mm from the center position was used.

Therefore, it was confirmed that there was a shielding effect even when a blind bore type superconductor cylinder was used.

[Embodiment B-3: Parallel arrangement of flanged disks]

Figure 11:
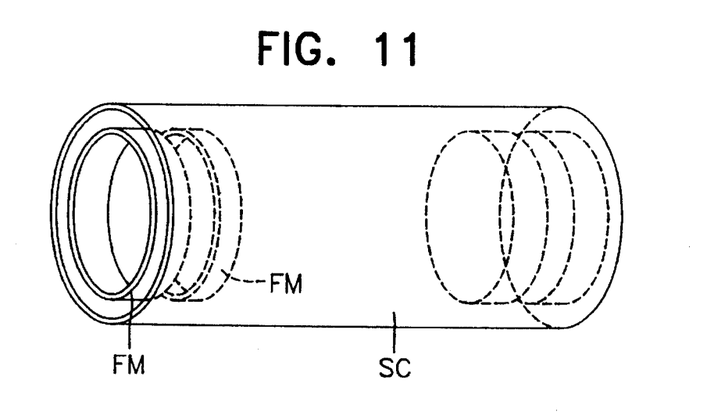
FIG. 11 shows a schematic perspective view of still another embodiment of the present invention in which the flanged disks are arranged in parallel inside the each end openings of the superconductor cylinder.

FIG. 11 is a schematic cross sectional end view in which flanged disks FM each having a single flange were disposed in parallel inside a double open end type superconductor cylinder SC of bismuth group oxide (BiSrCaCuO) (hereinafter referred to as a superconductor cylinder). The dimensions of the cylinder are 100 mm in inner diameter, 120 mm in length, and 5 mm in wall thickness. Those of the disks are 70 mm in inner diameter, 5 mm in flange width and 0.5 mm in thickness, and the permeability is 10000.

The magnetic field intensity in the center position on the cylinder axis in the cylinder bore was 0.0223 [Oe] when a uniform lateral magnetic field of 1 [Oe] was applied to the outside of the superconductor cylinder which is tested alone without the disks.

Next, four flanged disks constituting two pairs were so placed inside the superconductor cylinder that the each opening end of the flanged disks in each of the pairs were coincided with that of the superconductor cylinder, and that the center axes of cylinder and of disks were placed on a line, and the flanged disks were so disposed that their bottom surfaces were positioned at 80 mm and 115 mm from the center position in the superconductor cylinder. And the measurement was made in the same condition mensioned above. The magnetic field intensity at the center position in the superconductor cylinder was 0.0015 [Oe]. Further, the magnetic field intensity at the center position in the cylinder was 0.0069 [Oe] when only one disk was located at 115 mm from the center position. Comparing these values, the ratios among the shielding capabilities of respective shielding cylinder constructions were 3/10.7/100. There was clearly seen the effect of parallel arrangement of the flanged disks. Therefore, it is confirmed that magnetically shielding capability can be improved by the parallel arrangement of the flanged disks inside the cylinder.

[Embodiment C-1: Ring-like shaped disk (hole size)]

Figure 12:
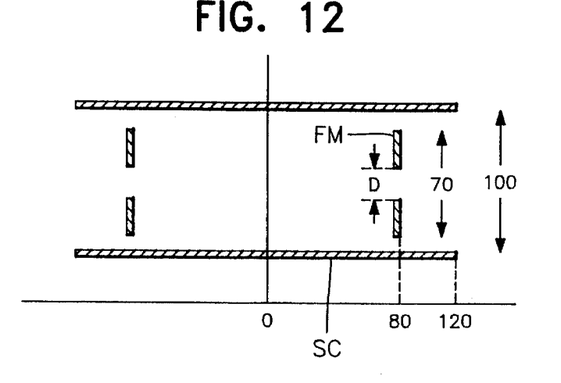
FIG. 12 shows a schematic cross sectional end view of still further embodiment of the present invention composed of a double open end type superconductor cylinder and a pair of disk plate with a central through hole, which is made of a high permeability material.

FIG. 12 is a schematic cross sectional end view of a double open end type superconductor cylinder SC of bismuth group oxide (BiSrCaCuO) (hereinafter referred to as a superconductor cylinder) and a pair of high permeability disks each having a through hole on the center portion (hereinafter referred to as a disk ring). The dimensions of the former are 100 mm in inner diameter, 240 mm in length and 5 mm in wall thickness. Those of the latter are 70 mm in inner diameter, 0.5 mm in thickness and the permeability is 10000. The diameter of the through hole is shown as D.

Figure 13:
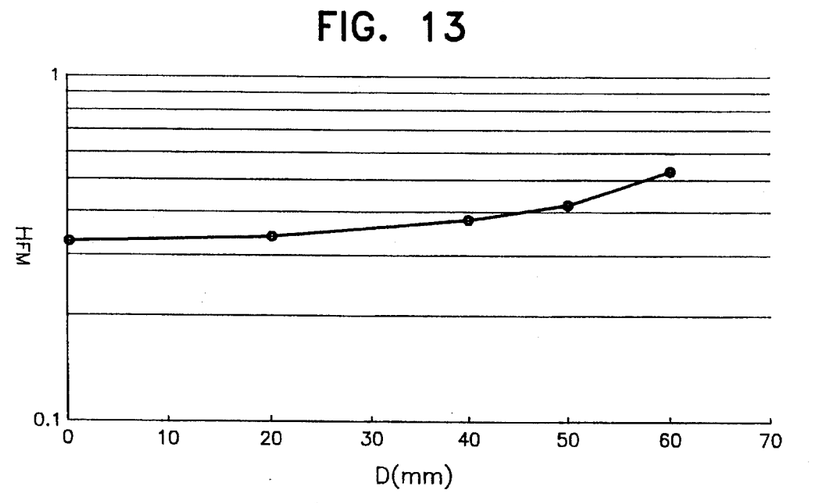
FIG. 13 is a diagram showing the results of investigation on the shielding capability in relation to a diameter D of the through hole formed in the disk plate.

As shown in FIG. 12, the shielding capability of the ring was investigated varying the through hole diameter D on the disk ring FM. The disk ring was disposed in the cylinder bore at a position where there was no influence of an opening end of the superconductor cylinder SC. FIG. 13 is a diagram showing the result. In the figure, the ordinate denotes shielding capability $H_{FM}$, and the abscissa denotes the diameter D (mm) of the through hole on the disk ring. As shown in the figure, it is understood that shielding capability gets worse with the increase in the diameter D of the through hole. The shielding capability in the case of the disk ring having the through hole diameter of 30 mm is almost the same as that of a disk without a through hole (D=0). This is similar to the case shown in the embodiment A-2 "effect of the radius of the disk plate", and it was found that even if a disk ring whose through hole diameter is smaller than 3/10 of the inner diameter of a superconductor cylinder is disposed in a position where the influence of an opening end is not exerted, the disk ring showes almost the same shielding capability as that of a high permeability disk plate without a through hole.

[Embodiment D-1: Parallel arrangement of high permeability members, part 1]

As shown in the embodiment B-3, it is confirmed that the shielding capability is improved by parallel arrangement of th flanged disks. Thereupon, various shapes of high permeability members FM are arranged in parallel in the inside bore of the superconductor cylinder SC.

Figure 14A:
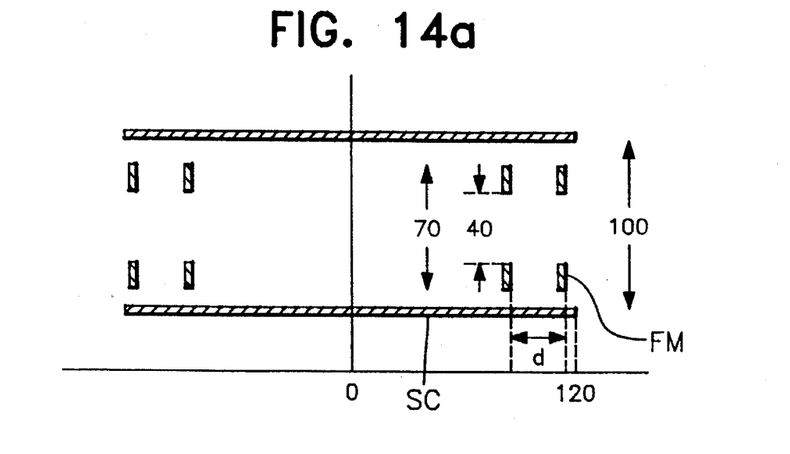
FIGS. 14a to 14c are cross sectional views respectively showing different modifications of parallel arrangement for two pairs of high permeability members of different shapes into the superconductor cylinder bore.
Figure 14B:
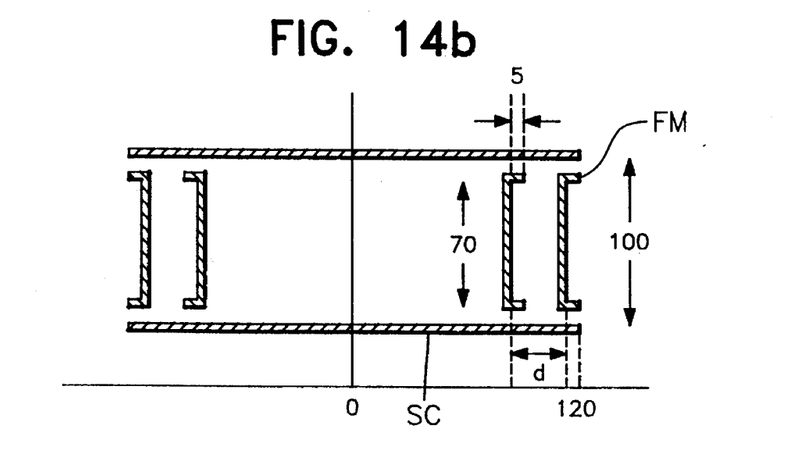
Figure 14C:
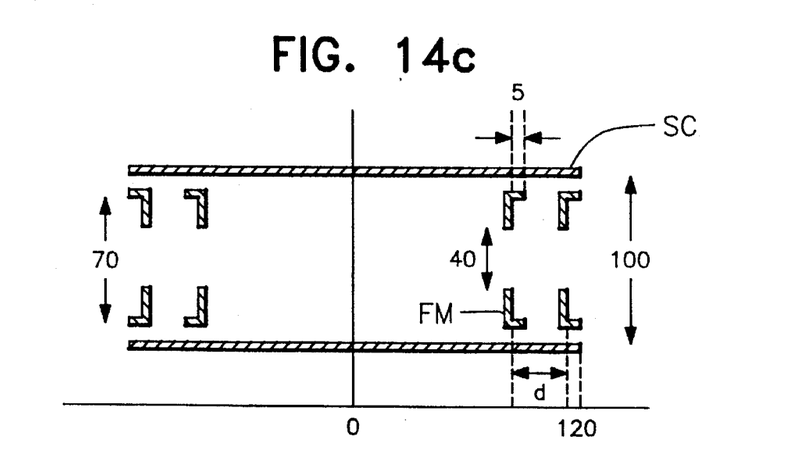

As the high permeability members FM, two pairs of the disk rings (FIG. 14a), two pairs of flanged disks (FIG. 14b) and two pairs of flanged disk rings (FIG. 14c) are arranged in parallel and inserted into the inside bore of a superconductor cylinder SC, and the shielding capability of the high permeability members are investigated. The dimensions of the superconductor cylinder SC are 100 mm in inner diameter, 240 mm in length and 5 mm in wall thickness, the dimensions of the disk rings are 70 mm in outer diameter, 0.5 mm in thickness, and the permeability is 10000, and the through hole diameter is 40 mm; the dimensions of the flanged disks are 70 mm in inner diameter and 0.5 mm in thickness and 5 mm in flange width, and the permeability is 10000; and the dimensions of the flanged disk rings are 70 mm in diameter and 0.5 mm in thickness, 5 mm in flange width and 40 mm in through hole diameter, and the permeability is 10000. The parallel arrangement was performed about high permeability members having the shapes as shown in FIGS. 14a, 14b and 14c.

Figure 15:
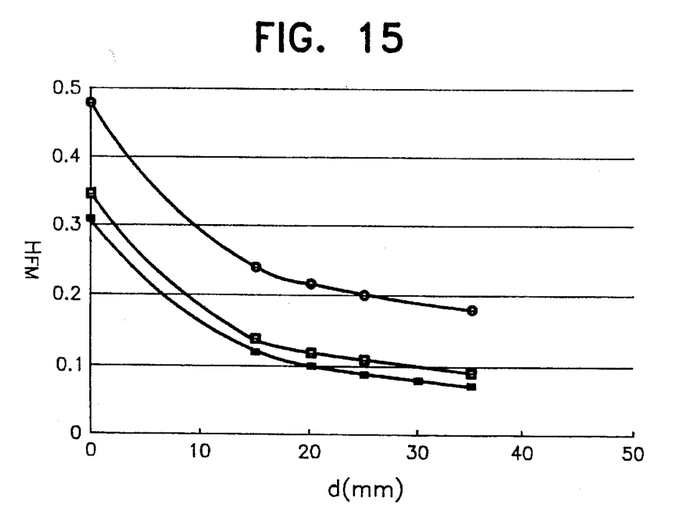
FIG. 15 is a diagram showing the results of investigation on the shielding performance which vary with the variation of the distance d between adjacent two pieces of the pair of the high permeability members arranged in parallel.
Figure 16A:
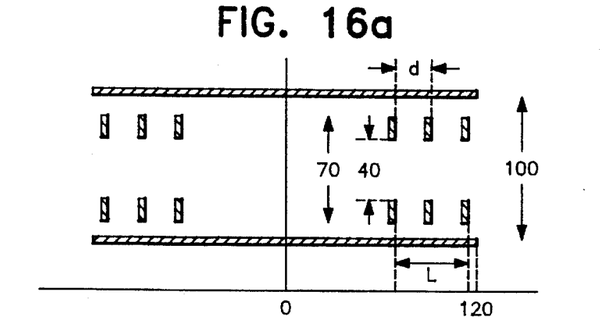
FIGS. 16a to 16d are cross sectional views respectively showing another dofferent modifications of parallel arrangement for two groups of high permeability members of different shapes into the superconductor cylinder bore.
Figure 16B:
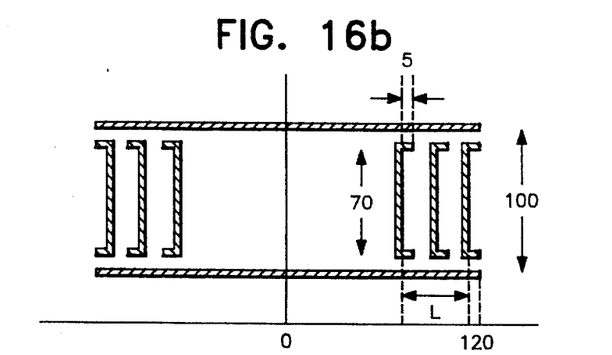
Figure 16C:
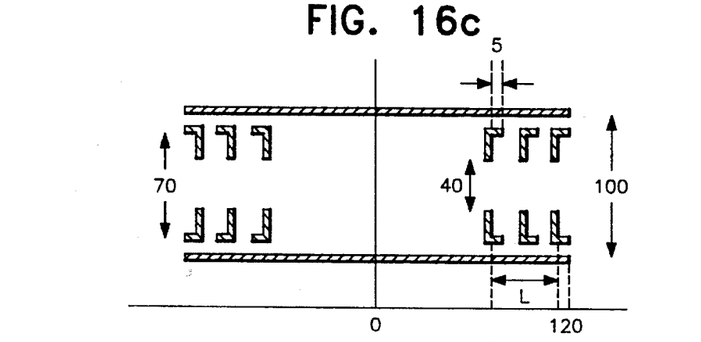
Figure 16D:
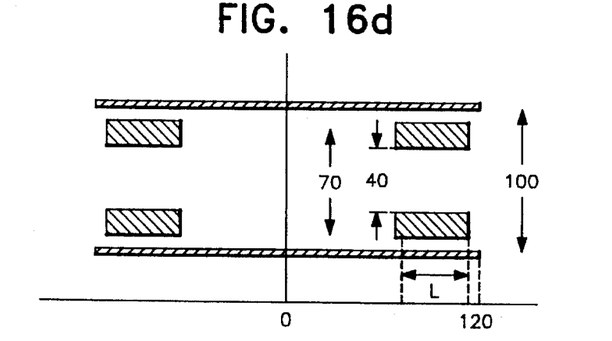

As shown in the figures, the position of one the high permeability members on the outes side was fixed in each pair and another high permeability member inside the fixed member was moved to vary the distance d therebetween, and the shielding capability of the high permeability members was investigated. The result is shown in FIG. 15 in which the ordinates denotes shielding capability $H_{FM}$ and the abscissa denotes the distance d (mm) between the high permeability members in each of the pairs. In the figure, a line plotted with a mark ○ expresses that of the disk ring, a line plotted with a mark ■ expresses that of the flanged disk and a line plotted with a mark □ expresses that of the flanged disk ring.

From FIG. 15, it is understood that the shielding capability is improved with the increase in the distance d between high permeability members FM. If the distance d=0, however, the shielding capability shows the value corresponding to that of the case where only a fixed high permeability member is used. In comparison to this, the shielding capability of lower harf value can be obtained in the case where at least one additional high permeability member is inserted inside the fixed one as shown in FIGS. 14a to 14c, thus it is clearly confirmed that there is an effect of the parallel arrangement of the high permeability members.

[Embodiment D-2: Parallel arrangement of high permeability members, part 2]

Figure 17:
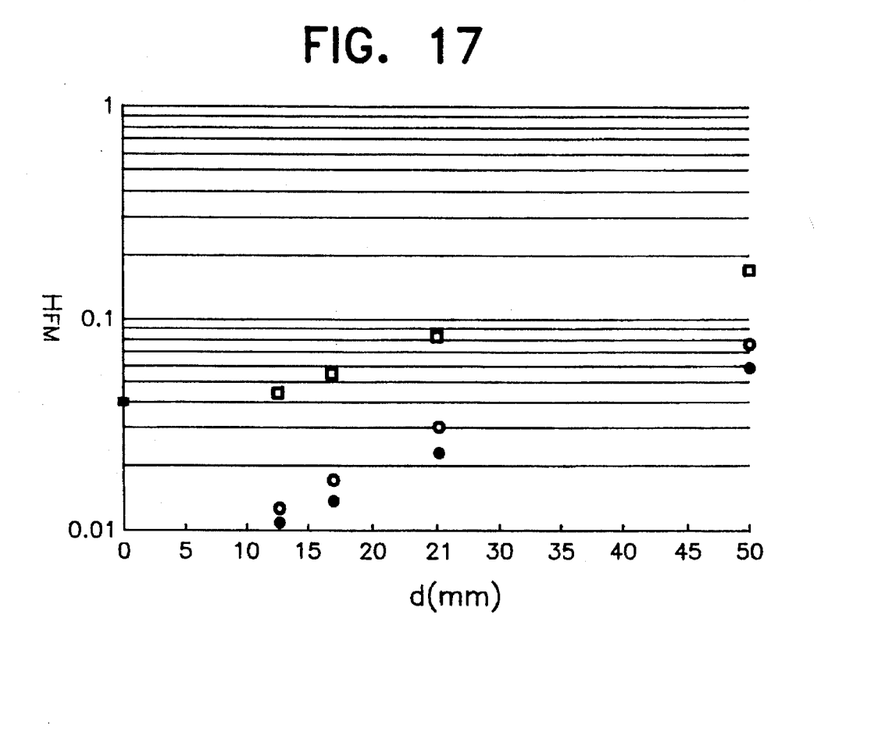
FIG. 17 is a diagram showing the results of investigation on the shielding capability depending on the number of arrangement of the high permeability members.

As shown in FIGS. 16a to 16d, using high permeability members FM of disk rings (FIG. 16a), flanged disks (FIG. 16b) and flanged disk rings (FIG. 16c), in each case, several layers of high permeability members FM of the same shape were inserted in a section of distance L=50 mm, and the shielding capability of the high permeability members in these cases was investigated. For comparison, the shielding capability of a disk ring of 52 mm thick (FIG. 16d) was also investigated. The result is shown in FIG. 17 in which the ordinate denotes shielding capability $H_{FM}$, and the abscissa denotes the distance d (mm) between the high permeability members. In the figure, a mark □ shows that of disk rings, a mark ● shows that of flanged disks, a mark ○ shows that of franged disk rings and a mark ■ shows that of the disk ring of 52 mm thick. In this embodiment, since the range L into which high permeability members are to be inserted is 50 mm, the value of the distance d=25 mm or 16.7 mm, for example, shows that three or four high permeability members to be arranged in the range.

From FIG. 17, it is understood that shielding capability is improved with the increase in the number of high permeability members. The arrangement of the distance d=0 corresponds to the case where the thickness of the disk ring is 52 mm or to the case where the equivarent number of disk rings are laminated without gaps. Therefore, the shielding capability when the number of lamination of disk rings is increased corresponds to that of a disk ring or cylinder having a thickness almost equivarent value to the lamination number. In this case, the shielding capability when five disk rings are arranged in parallel and that of the thick disk ring of 52 mm show almost the same value, so that the necessary metal amount for the disks is lower than that of the thick disk for obtaining similar shielding capability. In the case of flanged disk rings, similarly to the above, when more number of high permeability members are laminated, better shielding capability can be obtained. The minimum distance between flanged disk rings is actually 7 mm, and if the flange portion of the ring is neglected, however, their effect corresponds to that of the disk ring. Therefore, it is considered that the shielding capability characteristic of the parallel arangement of the flanged disk rings has a minimum value of shielding capability at a certain distance and then approaches to that of the thick disk ring. The shielding capability of the parallel arrangement of the flanged disk rings is better than that of the thick disk ring or disk rings thereby effectively decreasing the magnetic field in the cylinder bore.

In view of the results so far obtained, it is understood that shielding capability can be improved with the increase in the distance between high permeability members. In a case, however, where high permeability members have to be disposed in a limited range, it is confirmed that a parallel arrangement of several pieces of the members is able to improve shielding capability effectively.

Industrial Applicability

[Shapes of high permeability members]

As described in the above, high permeability members of respective shapes depend upon a plurality of parameters, in other words, best shielding capability can be obtained with the balance of respective parameters. In some case, however, the shape of the superconductor cylinder or that of the high permeability member may be limited by applying conditions, etc., so that it is necessary to consider their shapes according to the actual aplications. In some cases, all the combinations of shapes shown in Table 1 can exist.

TABLE 1

| Shapes of high permeability members | Shielding capability | Operability from exterior | Parameters on which shielding capability depends |
|---|---|---|---|
| Disk plate | Good | Bad | Radius, Thickness, Position, Permeability |
| Thick disk plate | Good | Bad | Radius, Thickness, Position, Permeability |
| Flanged disk | Good | Bad | Radius, Thickness, Position, Flange width, Permeability |
| Disk ring | Good | Good | Radius, Thickness, Position, Permeability, Through hole |

TABLE 1-continued

| Shapes of high permeability members | Shielding capability | Operability from exterior | Parameters on which shielding capability depends |
|---|---|---|---|
| Thick disk ring | Good | Good | diameter Radius, Thickness, Position, Permeability, Through hole diameter |
| Flanged disk ring | Good | Good | Radius, Thickness, Position, Flange width, Permeability, Through hole diameter |

I claim:

1. A magnetically shielding structure comprising a cylindrical shielding body of a superconductive material which manifests Meissner effect after transition from a normal conductive state to a superconductive state when said body is cooled below a predetermined critical temperature, and a high permeability member disposed in the vicinity of an opening end of said body and spaced by a gap from an inner wall of said body.

2. A magnetically shielding structure according to claim 1, wherein said high permeability member is disposed in the range from a position located in an inner portion from the opening end by a distance to be free from a magnetic influence of the opening end to a deeper position inside the body where a residual magnetic field (Hr) in the high permeability member substantially equals to an internal magnetic field to be expressed by the product of a shielding capability (Hf) of said high permeability member and a magnetic field (Hs) inside said cylindrical shielding body, where Hr=Hf×Hs.

3. A magnetically shielding structure according to claim 1, wherein said high permeability member has a size of more than 3/10 of the inner diameter of said cylindrical shielding body.

4. A magnetically shielding structure according to claim 1, wherein said high permeability member has a shape selected from a group consisting of a plate intersecting with the longitudinal direction of said shielding body, a flanged plate provided with an outer flange extending in the longitudinal direction of said shielding body, and a pillar-shaped body having an axis along an axial direction of said cylindrical shielding body.

5. A magnetically shielding structure according to claim 4, wherein said high permeability member has a ring-like shape provided with a through hole along the axial direction of said shielding body in said plate, said flanged plate or said pillar-shaped body.

6. A magnetically shielding structure according to claim 1, wherein said high permeability member includes a plurality of high permeability pieces arranged in parallel in the axial direction of said cylindrical shielding body at a predetermined interval.

* * * * *